(12) United States Patent
Kaabouch et al.

(10) Patent No.: US 8,417,902 B2
(45) Date of Patent: Apr. 9, 2013

(54) ONE-TIME-PROGRAMMABLE MEMORY EMULATION

(75) Inventors: Majid Kaabouch, Rousset (FR); Carine Lefort, Trets (FR); Jean-Pascal Maraninchi, Marseilles (FR)

(73) Assignee: Atmel Corporation, San Jose, CA (US)

(*) Notice: Subject to any disclaimer, the term of this patent is extended or adjusted under 35 U.S.C. 154(b) by 1016 days.

(21) Appl. No.: 12/185,932

(22) Filed: Aug. 5, 2008

(65) Prior Publication Data

US 2010/0037000 A1    Feb. 11, 2010

(51) Int. Cl.
   *G06F 12/00* (2006.01)
(52) U.S. Cl.
   USPC .......................................... 711/156; 711/163
(58) Field of Classification Search .................. 711/156
   See application file for complete search history.

(56) References Cited

U.S. PATENT DOCUMENTS

| | | | |
|---|---|---|---|
| 5,404,485 A | 4/1995 | Ban | |
| 6,856,531 B2 | 2/2005 | Turner et al. | |
| 6,950,918 B1 | 9/2005 | Estakhri | |
| 7,013,188 B2* | 3/2006 | Nicolle et al. | 700/86 |
| 7,031,188 B2 | 4/2006 | Lee et al. | |
| 2005/0275426 A1* | 12/2005 | Hsu | 326/38 |
| 2006/0262626 A1 | 11/2006 | Lin et al. | |
| 2007/0133269 A1 | 6/2007 | Lee et al. | |
| 2007/0157000 A1* | 7/2007 | Qawami et al. | 711/170 |

OTHER PUBLICATIONS

Handschuh and Trichina "High Density Smart Cards: New Security Challenges and Applications" Isse/secure 2007 Securing Electronic Business processes: Highlights of the Information Security Solutions Europe/SECURE 2007 conference, N. Pohlmann, H. Reimer, W. Schneider (Editors): Securing Electronic Business Processes, Vieweg (2007), pp. 251-259.

* cited by examiner

*Primary Examiner* — Tuan Thai
*Assistant Examiner* — Ngoc Dinh
(74) *Attorney, Agent, or Firm* — Fish & Richardson P.C.

(57) ABSTRACT

This document discloses one-time-programmable ("OTP") memory emulation and methods of performing the same. OTP memory can be emulated by managing reads and writes to a memory array in response to an instruction to write data to a OTP memory location and selectively setting a security flag that corresponds to the memory locations. The memory array can be a NAND Flash memory array that includes multiple pages of memory. The memory array can be defined by memory blocks that can include multiple pages of memory. When an OTP write instruction is received, previously stored data can be read from a first page of memory, combined with the new data and stored to a target page of memory. A security flag can be set to prevent the target page from being reprogrammed prior to an erase.

17 Claims, 5 Drawing Sheets

ONE-TIME-PROGRAMMABLE MEMORY EMULATION

BACKGROUND

This specification relates to one-time-programmable memory emulation.

Devices are being used to store more information electronically. Some of the data being stored is sensitive data. For example, medical records and financial information can be stored in devices to increase accessibility to the information by authorized users. The sensitivity of the data being stored can be considered when determining the type of device and security measures that are implemented to protect the data.

An example device that is used to store information electronically is a smart card. Smart cards can store information in memory that is embedded in the card. The memory can be used to store financial information, medical records, identification information, as well as other sensitive personal data. In addition to storing sensitive personal data, Smart cards can also store sensitive program data. Examples of sensitive program data can include parameter tables used to configure an operating system, a jump table that can be used for software patches, information related to life cycle management of the device, master keys for cryptographic applications, etc.

Once information is stored in the memory of the smart card, the card can be read by computing devices that are equipped with peripherals that can interface with the smart cards. One-time-programmable memory can be used to increase the security of data because once the data has been written to memory it cannot be altered. For example, one or more pages of OTP memory can be implemented with other pages of non-volatile memory. However, using one-time-programmable data can sometimes result in inefficiencies related to the use of available memory.

SUMMARY

This document discloses one-time-programmable ("OTP") memory emulation and methods of performing the same. OTP memory can be emulated by managing reads and writes to a memory array in response to an instruction to write data to an OTP memory location and selectively setting a security flag that corresponds to the memory locations. The memory array can be defined by NAND Flash memory blocks. The memory blocks can include multiple pages of NAND Flash memory. A subset of the available NAND Flash memory can be used to emulate the OTP memory.

When an OTP write instruction is received, previously stored data can be read from a first page of memory, combined with the new data and stored to a target page of memory. A security flag can be set to prevent the target page from being reprogrammed prior to an erase.

Particular implementations of the subject matter described in this specification can be implemented so as to realize one or more of the following optional advantages. Memory can be used more efficiently in one-time-programmable environments. Devices (e.g., Smart cards) using NAND Flash memory can be used in systems that require one-time-programmable memory. Higher memory capacities can be achieved with one-time programmable emulation because higher memory capacities can be realized using NAND Flash memory rather than one-time-programmable memory.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This document discloses one-time-programmable ("OTP") memory emulation. The OTP emulation can be implemented, for example, using NAND Flash memory. In one particular example, two blocks of NAND Flash memory can be used to emulate one page of OTP memory. A subset of the available flash memory can be used to emulate the OTP memory without disturbing the remaining NAND Flash memory. In this particular example, the amount of physical memory will differ from the amount of memory that is visible to a computing device. For example, when two blocks of NAND Flash memory are used to emulate a single page of OTP memory, the total memory that is visible to a computing device is N−2 blocks of Flash +1 page of OTP, wherein N is the number of physical NAND Flash memory blocks available.

In some implementations, an emulator can receive an OTP instruction including OTP data from a computing device. In turn, the emulator can identify a visible page of flash memory (e.g., visible to the computing device) and read data that is stored in the visible page. The emulator can update the data read from the visible page with the OTP data received from the computing device, and store the updated data in a target page in OTP memory. The target page is a page of OTP memory in which all bytes are at a hexadecimal logic value FF. The target page can be identified as blank based on one or more security indicators (e.g., one or more security bytes) and one or more values stored in the target page.

Once the target page has been programmed with the updated data, a security indicator can be set to identify the target page as a programmed and locked page. Once the security indicator is set, the address of the target page can be stored into a visible page pointer and the target page can be identified by the emulator or a CPU as the visible page.

At power-on, the emulator identifies the visible page by searching the pages of flash for a first page that has its security indicator set. The address of this page can be stored in the visible page pointer. If multiple pages have set security indicators, the emulator can determine which address to store in the visible page pointer according to the addresses of the pages. For example, the emulator can select a highest address of the pages having set security indicators as the visible page pointer. The visible page pointer can be updated with addresses of successfully programmed target pages, and thereafter, the emulator can identify the visible page based on the visible page pointer. When the visible page pointer stores a page address associated with a particular block, pages that are not in the particular block can be erased.

§1.0 One-Time-Programmable Memory Environment

Figure 1:
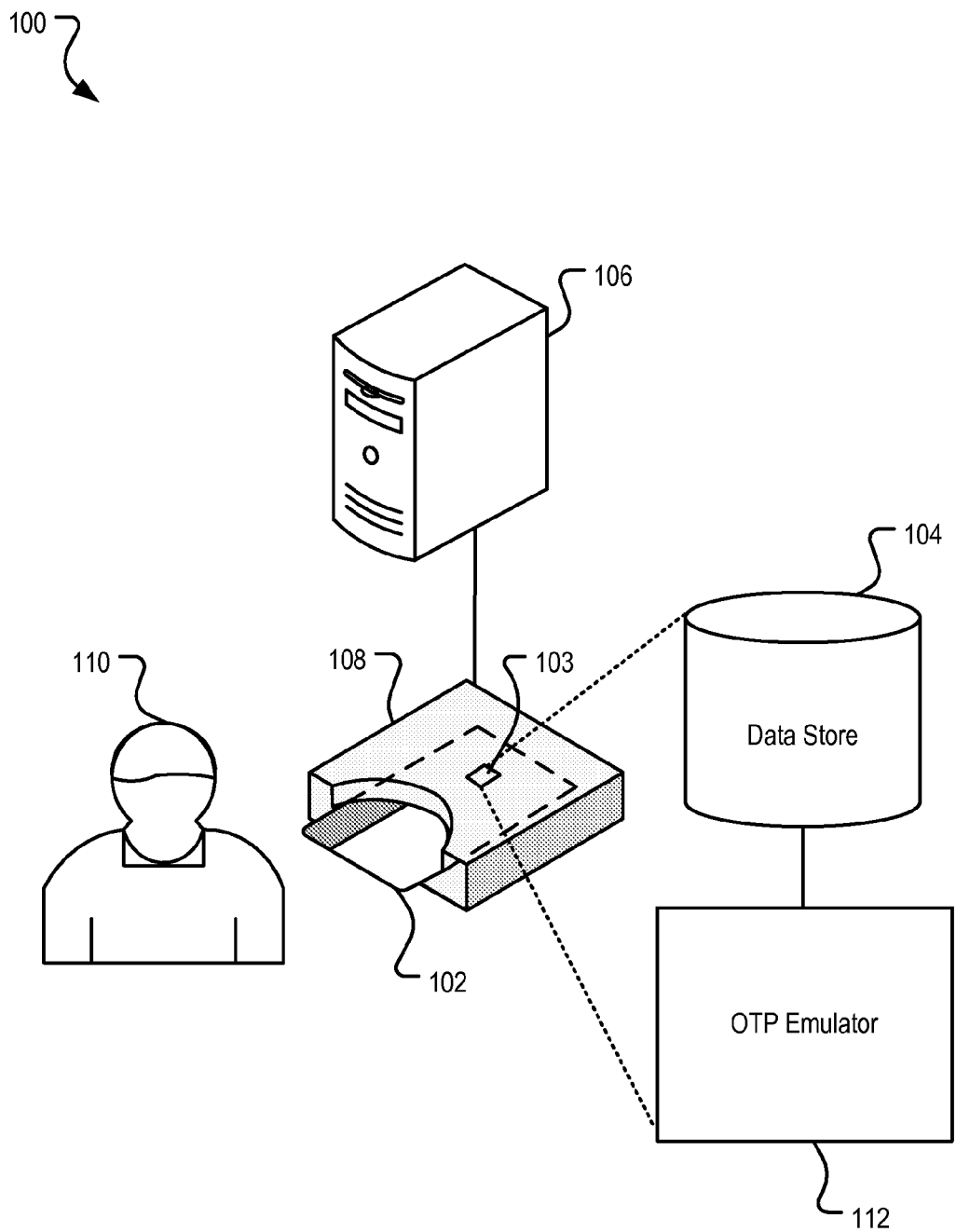
FIG. 1 is a diagram of an example environment in which one-time-programmable memory can be implemented.

FIG. 1 is a diagram of an example environment in which one-time-programmable memory can be implemented. A smart card 102 is a card device that can include an embedded integrated circuit chip 103. The integrated circuit chip can include a memory structure, or a secure microcontroller that includes a memory structure, that can operate as a data store 104. The data store 104 of the smart card 102 can store digital information that can be accessed by a computing device 106 that is in communication with the smart card 102. The computing device 106 can communicate with the smart card 102 through direct contact with the smart card 102, or over a wireless connection.

The computing device 106 can be equipped with an interface peripheral 108 (e.g., smart card reader) to facilitate direct contact with the smart card 102. A smart card user 110 can insert the smart card 102 into the interface peripheral 108. Once the smart card 102 is inserted, the interface peripheral 108 can make contact with the integrated circuit chip 103. In turn, the computing device 106 can access the data store 104 or communicate with the microcontroller to store and retrieve data from the data store 104. Interface peripherals can also have wireless capabilities that facilitate wireless communication with the smart card 102.

Smart cards 102 can be used in applications that require security to protect the data that is stored on the smart card. For example, smart cards 102 can be used as credit/debit cards, to store sensitive healthcare data, and to access secure buildings. Therefore, it may be advantageous to prevent unauthorized manipulation of the information stored in the data store 104. To protect the integrity of the data stored in the data store 104, the data store 104 can be implemented using OTP memory. OTP memory is memory that can only be programmed one time before it is erased. Therefore, once a unit of the OTP memory is programmed, it cannot be changed until it is first erased.

NAND Flash memory can have page level write granularity so that each page of the NAND Flash memory can be programmed without disturbing other pages in the NAND Flash memory array. However, NAND flash memory architecture can subject the NAND flash memory to potential "write disturbs" when multiple write operations are used to program the separate bytes of the same page. A write disturb can be an unwanted modification of a byte in the flash memory array that is caused by the high voltage signals that are applied to the array during a program cycle. For example, the high voltages applied to the array can result in a state change of an already programmed byte that, in turn, can result in corrupt data.

In some implementations, an OTP memory having a write granularity less than a page (e.g., byte level write granularity) can be emulated using a NAND Flash memory structure and an OTP emulator 112. In these implementations, the OTP emulator 112 can receive OTP write instructions from the computing device 106. In turn, the OTP emulator 112 can access multiple pages of NAND Flash memory that can be programmed in a defined, or random, sequence to facilitate OTP functionality.

§2.0 One-Time-Programmable Memory Emulation

Figure 2A:
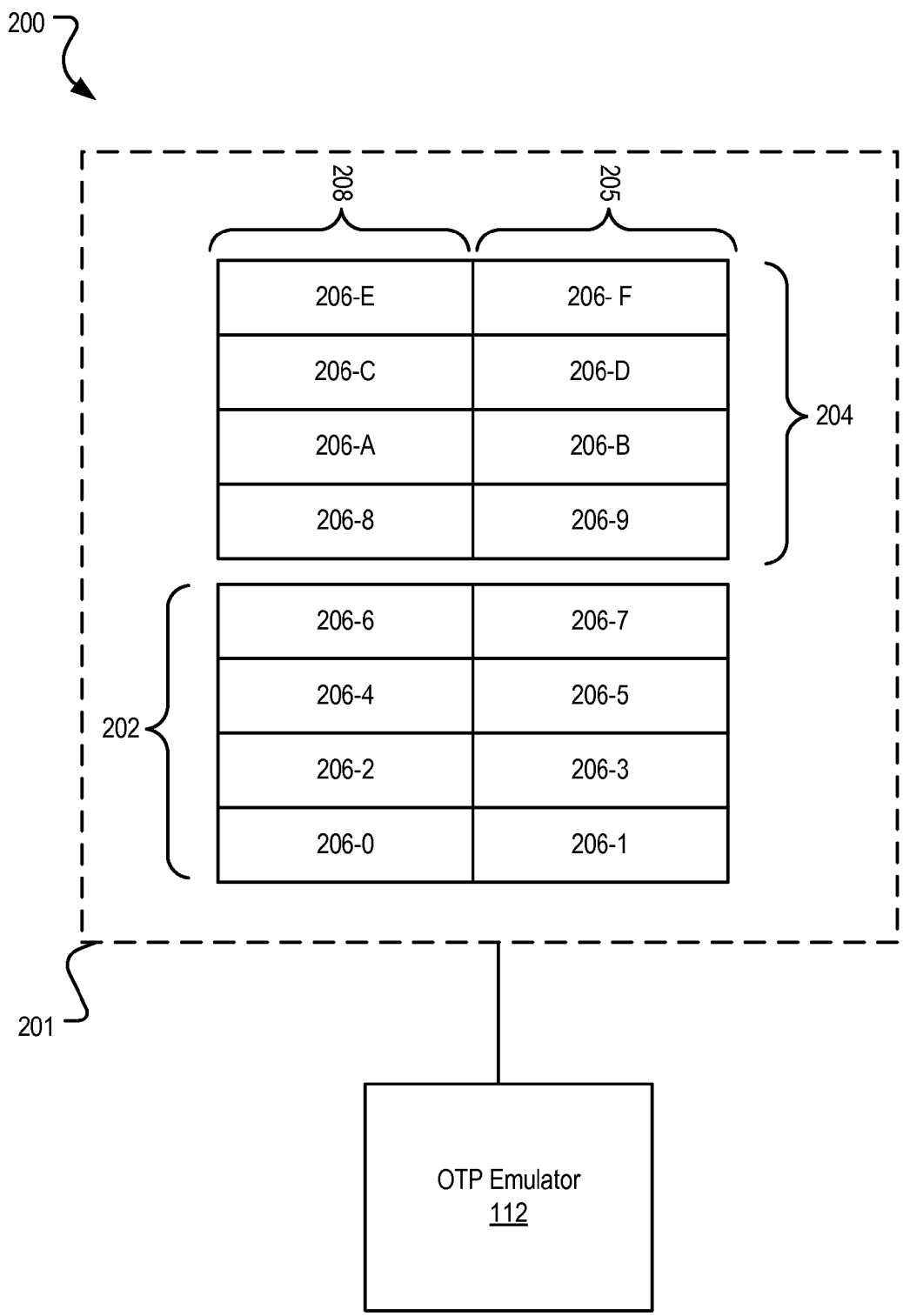
FIG. 2A is an example OTP emulation system.

FIG. 2A is an example OTP emulation system 200. In some implementations, the OTP emulation system 200 can include a NAND Flash memory structure 201 and an OTP emulator 112. The OTP emulation system 200 can be implemented, for example, on a smart card (e.g., smart card 102) or any other device or system in which OTP memory is used. In some implementations, the OTP emulator 112 can receive OTP memory instructions and manage the available NAND Flash resources to emulate OTP.

§2.1 Example Emulator Programming

In some implementations, the OTP emulator 112 can store one page of OTP data in the example NAND Flash memory structure 201 in response to one or more OTP write instructions. In these implementations, the NAND Flash memory structure 201 can include a first memory block 202 and a second memory block 204. Each memory block 202, 204 can include multiple pages of memory 206. For example, the first memory block 202 can include eight pages of memory 206-0-206-7. Similarly, the second memory block 204 can include eight pages of memory, 206-8-206-F.

In some implementations, each even page 208 in the first memory block 202 and the second memory block 204 can have a corresponding odd page 205 in the first memory block 202 and the second memory block 204, respectively. For example, pages 206-0, 206-2, 206-4, and 206-6 of the first memory block 202 can correspond to pages 206-1, 206-3, 206-5, and 206-7, respectively. Similarly, the even pages 206-8, 206-A, 206-C, and 206-E in the second memory block 204 can correspond to the odd pages 206-9, 206-B, 206-D, and 206-F, respectively. While even pages 208 are presented adjacent to corresponding odd pages 205 for clarity of description, corresponding pages can be located at any location within the same block as the pages to which they correspond.

In some implementations, the OTP emulator 112 can store OTP data in the even pages 208 upon receipt of an OTP write operation. In these implementations, the OTP emulator 112 can store status indicators and other information in the odd pages 205.

A security indicator is an example status indicator that can be stored in the odd pages 205. In some implementations, the security indicator can be one or more bytes of an odd page 205 that designates the corresponding even page 208 as a locked page. When an even page 208 is designated as locked, the even page 208 cannot be programmed again prior to being erased. This prevents the even page 208 from being altered and facilitates OTP memory functionality at a page level.

For example, OTP data can be stored in page 206-0 of the first memory block 202. When page 206-0 is successfully programmed, the security byte located in page 206-1 can be set to a defined value so that page 206-0 is designated as locked. Once the security byte in page 206-1 is set to the defined value, page 206-0 cannot be programmed again prior to an erase. Thus, OTP programming at the page level can be performed with NAND Flash memory by using a security byte to lock the page following a full page write.

When less than a page of data is written in a single OTP memory write, the NAND Flash page can contain less than a full page of data, but also be locked. Accordingly, additional bytes of data cannot be written to the empty bytes that remain in the NAND Flash page without first performing an erase on the page. However, the OTP emulator 112 can emulate OTP memory having OTP memory units that are smaller than a page. In some implementations, the OTP emulator 112 can use the architecture of the example NAND Flash memory structure 201 so that additional bytes of data can be written to a common page as the data contained in the partially programmed page, without performing multiple write operations on the partially programmed page.

In some implementations, the OTP emulator 112 can write additional bytes of OTP data to a target page (e.g., blank page) with the data that is contained in a partially programmed page by writing the additional bytes of OTP data and the data that is contained in the partially programmed page to the target page. The target page can be the even page 208 having the next highest address, or any other blank page.

Figure 2B:
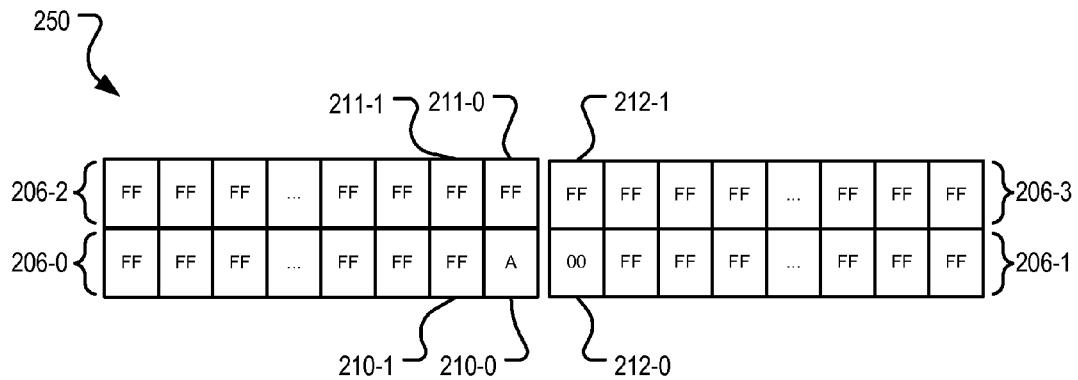
FIGS. 2B-2D are block diagrams of example memory states during emulation of OTP memory writes using NAND Flash memory.
Figure 2C:
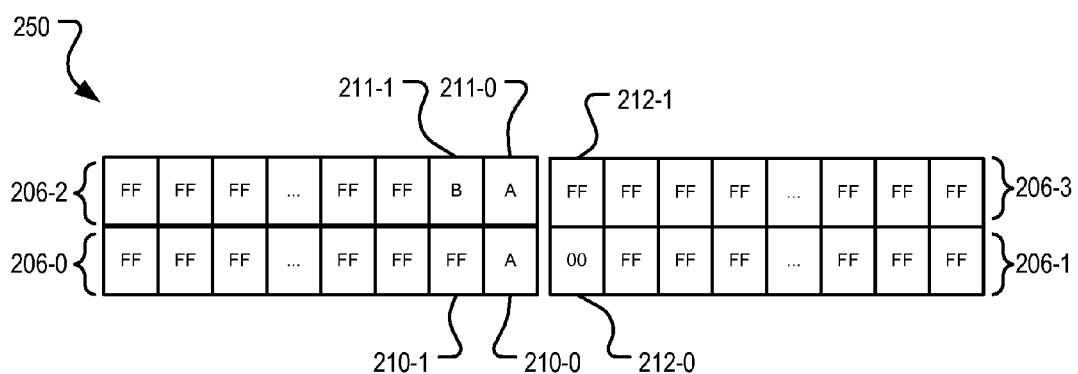
Figure 2D:
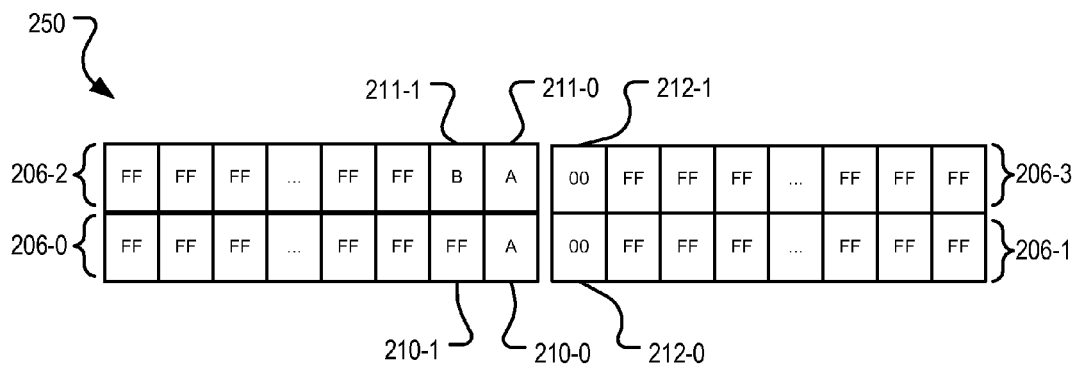

FIGS. 2B-2D are block diagrams of example memory states during emulation of OTP memory writes using NAND Flash memory. Four pages 206-0-206-3 of the first memory block 202 are presented in FIG. 2B. The page width of each page 206-0-206-3 can be 64 bytes, 128 bytes, or any other appropriate page width. Page 206-0 is partially programmed and contains data in a first byte 210-0. Other bytes in page 206-0 contain the hexadecimal value FF, indicating that the bytes have not been programmed since the last erase. Page 206-1 corresponds to page 206-0 and contains a security byte 212-0 having a value 00, indicating that page 206-0 has been locked. Therefore, no additional writes can be performed on page 206-0 until page 206-0 is erased.

Each byte of page 206-2 has the hexadecimal value FF, indicating that page 206-2 is blank. Similarly, the security byte 212-1 of page 206-3 has the hexadecimal value FF, indicating that page 206-2 has not been locked. Therefore, page 206-2 can be a target page and, in turn, data can be written to page 206-2.

When the OTP emulator 112 of FIG. 2A receives an OTP write instruction to store a new data value B in, for example, byte 210-1, the OTP emulator 112 can not store the value in byte 210-1 because page 206-0 is locked. However, page 206-2 is not locked because the security bit 212-1 that corresponds to page 206-2 contains the hexadecimal value FF. Therefore, the new data value B and the value stored in byte 210-0 can both be stored in page 206-2.

In some implementations, the OTP emulator 112 can read the data that is stored in page 206-0 (e.g., byte 210-0) and combine the read data with the data received with the OTP write instruction. In turn, the OTP emulator can write the data read from byte 210-0, in page 206-0, and the received data to bytes 211-0 and 211-1, respectively. FIG. 2C is a block diagram of the resulting memory state.

As shown in FIG. 2C, byte 211-0 contains value A that was previously stored in byte 210-0, while byte 211-1 contains the new data value B that was received with the OTP write instruction. Once the write operation has been completed, the OTP emulator can lock page 206-2 by programming the security byte 212-1 in page 206-3 (e.g., corresponding to page 206-2) to the value 00, as shown in FIG. 2D. Thus, the data stored in page 206-2 cannot be manipulated and the page is also protected from write disturbs because only one write is performed on the page.

The OTP emulator can perform additional OTP write operations in a similar manner to that described above so that additional bytes of data can be written to bytes in the same page of NAND Flash memory as previously stored data. In some implementations, the OTP emulator 112 can determine the next page to be written based on a visible page pointer. A visible page pointer can be a page address stored in a register (e.g., a register in a memory controller) that is accessible to a computing device that is accessing an OTP memory. The page address can correspond to a page of OTP memory that is visible to (e.g., accessible by) the computing device. The OTP emulator 112 can, for example, store the address of the last NAND Flash memory page that was successfully written (e.g., programmed and locked) as the visible page pointer so that the computing device can identify the next blank byte in the visible page.

When a computing device provides data to be written to the next available byte, the OTP emulator 112 can store data to a corresponding byte in another NAND Flash memory page and store the new page address as the visible page pointer. For example, the OTP emulator 112 can program pages in sequential order of page address. Accordingly, when pages are stored in sequential order of page address, the pages in the first memory block 202 can be programmed prior to any pages in the second memory block 204 being programmed. While sequential programming of pages is provided, other page programming orders can be used.

The visible page pointer can also be used to manage data reads by a computing device. For example, when a computing device attempts to read data from the NAND Flash that is being used to emulate the OTP memory, the computing device can reference the visible page pointer to identify the location of the data to be read. Similarly, when the computing device is programmed to access a single page of OTP memory, it may be programmed with a static page address that corresponds to the OTP memory. Therefore, every read instruction from the computing device would be directed to a single page. The OTP emulator 112 can receive the read instruction and reference the visible page pointer to retrieve the correct data and provide it to the computing device without requiring the computing device to provide the actual location of the data in the NAND Flash.

§2.2 Example Flash Memory Management

As discussed above, the OTP emulator can write data to pages of NAND Flash memory in response to OTP write instructions. However, once all pages of the NAND Flash memory have been written, additional data cannot be written until at least one page is erased. Therefore, erase functions can be performed periodically, or in response to a trigger event, so that previously written pages of NAND Flash can be used for subsequent OTP write operations.

When an erase is performed on the NAND Flash memory, each byte that is erased can be set to the hexadecimal value FF, indicating that the byte is available for programming. In some implementations, the NAND Flash memory can be erased with block granularity. In these implementations, the OTP emulator 112 can erase a memory block when a last programmed page is not located in the block to be erased. For example, referring again to FIG. 2A, the OTP emulator 112 can erase block 202 when the last programmed page was located in block 204. Similarly, the OTP emulator 112 can erase block 204 when the last programmed page was located in block 202.

In some implementations, the OTP emulator 112 can identify the last programmed page based on the visible page pointer. As discussed above, the visible page pointer that is stored by the OTP emulator 112 can identify the page address of the last NAND Flash page that was successfully programmed by the OTP emulator 112. Accordingly, the OTP emulator can use the page address stored in the visible page pointer to determine whether a particular block of data can be erased.

For example, if the visible page pointer indicates that page 206-A was the last page programmed by the OTP emulator 112, then the first memory block 202 can be erased without erasing the last programmed page of data. Similarly, if the visible page pointer indicates that page 206-2 was the last page programmed by the OTP emulator, then the second memory block 204 can be erased without erasing the last programmed page of data.

When the OTP emulator 112 programs pages sequentially, an erase can be performed when the first page of another block is successfully programmed. For example, the first memory block 202 can be erased after page 206-8 is successfully programmed. Similarly, the second memory block 204 can be erased after page 206-0 is successfully programmed. Erasing each memory block after the first page of the other block is successfully programmed increases the probability that each memory block can be erased and available for programming when all of the pages of the other block are programmed.

§2.3 Example Power-Up Operations

In some implementations, the OTP emulator 112 can determine the status of the NAND Flash memory at power-up. For example, the OTP emulator 112 can determine the last page to be successfully programmed, the next page available for programming, and whether there was an attempted attack or power failure during a write. Determining the status of the NAND Flash memory enables the OTP emulator 112 to determine how to manage data received in a new OTP write instruction as well as facilitating identification of the page address that should be stored as the visible page pointer.

The OTP emulator 112 can determine the status of the NAND Flash memory, for example, by examining the values stored in each even page 208 and each corresponding odd page 205. In some implementations, the OTP emulator 112 can first write the received data in an blank even page, and then lock the even page by setting the security byte in the corresponding odd page to a defined value during a write cycle. Accordingly, in these implementations, the status of each page of the NAND Flash memory can be determined according to the values of the even and odd pages.

For example, if the OTP emulator 112 determines that an odd page 205 contains the defined value that identifies the corresponding even page 208 as locked, then the OTP emulator 112 can identify the corresponding even page 208 as a successfully programmed page.

In contrast, if the OTP emulator 112 determines that an even page 208 contains data but the security byte in the corresponding odd page 205 does not contain the defined value that identifies the even page 208 as locked, then the OTP emulator 112 can identify the even page as a page that was subjected to an attack, or otherwise failed to be successfully programmed (e.g., lost power during programming).

In some implementations, the OTP emulator 112 can determine the status of each page in the same order in which the pages are programmed. For example, if the pages are programmed in sequential order, then the OTP emulator 112 can determine the status of the pages in sequential order. Therefore, in this example, the OTP emulator 112 can first determine the status of page 206-0 based on the value of the bytes in page 206-0 as well as the value of the security byte in page 206-1. The OTP emulator 112 can begin by examining the value of the security byte of page 206-1. If the security byte is set to 00 (e.g., the defined value that identifies page 206-0 as locked), then the OTP emulator 112 can determine that page 206-0 has been successfully programmed and continue to page 206-2.

To determine the status of page 206-2, the OTP emulator can again begin by examining the value of the security byte of page 206-3. If the OTP emulator 112 determines that the value of the security byte of page 206-3 is not 00, then page 206-2 has not been locked. In turn, the OTP emulator 112 can examine the value of page 206-2. If all of the bytes of page 206-2 contain an erase value (e.g., hexadecimal value FF) then the OTP emulator 112 can determine that page 206-2 is available for programming. However, if any of the bytes of 206-2 contain a value other than the erase value (e.g., hexadecimal value FF), then the OTP emulator 112 can determine that programming of page 206-2 failed (e.g., power was interrupted during programming). The OTP emulator 112 can continue by determining status of the remaining even pages (e.g., even pages 206-4-206-E) in a manner similar to that described above.

Based on the status of the even pages, the OTP emulator 112 can determine how to process received OTP write instructions. In some implementations, the OTP emulator 112 can identify the highest even page 208 that is associated with a security byte having the defined value (e.g., 00) as the visible page. In turn, the OTP emulator 112 can store the address of the visible page as the visible page pointer. When an OTP write instruction is received, the OTP emulator 112 can identify the target page based on the visible page pointer.

Continuing with the example above, if page 206-0 is identified as the visible page, then the OTP emulator 112 can identify the next blank page (e.g., 206-4) as the next page to be programmed. In this example, page 206-2 can be bypassed because the OTP emulator 112 determined that page 206-2 was improperly programmed. Therefore, the next blank page can be used as the target page for additional OTP write instructions.

§3.0 Example One-Time-Programmable Emulator

Figure 3:
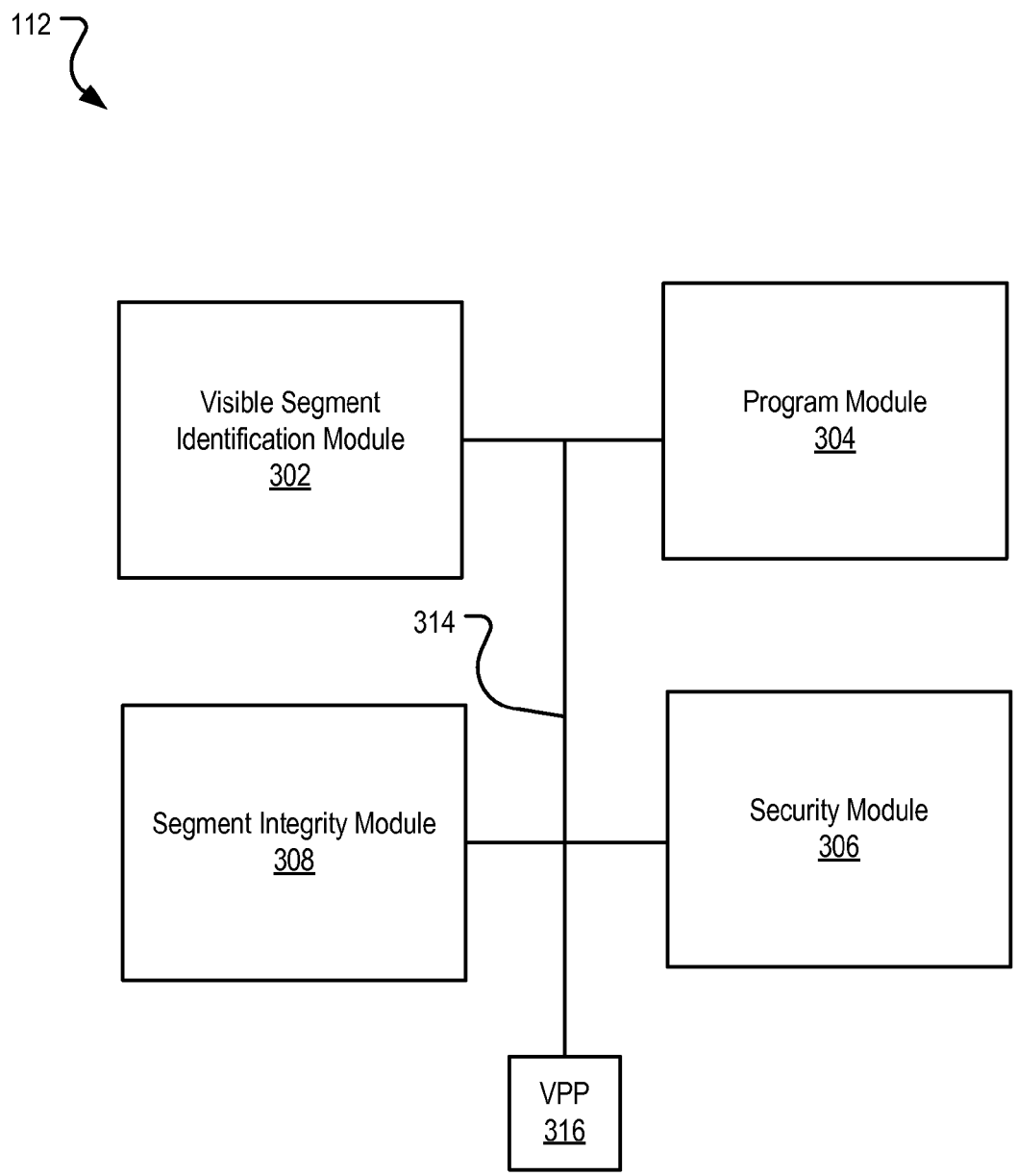
FIG. 3 is a block diagram of an example OTP emulator.

FIG. 3 is a block diagram of an example OTP emulator 112. In some implementations, the example OTP emulator 112 can include a visible segment identification module 302, a program module 304, a security module 306, and a segment integrity module 308. The OTP emulator 112 can be implemented in electronic circuitry, for example, to emulate OTP memory using NAND flash memory. The modules of the OTP emulator 112 can be connected to a common communications bus 314 so that information can be shared between the modules.

In some implementations, the visible segment identification module 302 is operable to identify a memory segment that is visible to a peripheral device (e.g., a computing device that is providing OTP memory instructions). The visible segment identification module 302 can identify the visible memory segment (e.g., page 206-0 of FIG. 2B) in a NAND Flash memory based on the security byte (e.g., byte 212-1 of FIG. 2D) that is associated with each page of the NAND Flash memory. For example, the visible segment identification module 302 can identify the visible segment as a highest addressed page of memory in a block that is associated with a security indicator (e.g., an indicator that identifies the page as successfully programmed).

The visible segment identification module 302 can provide the address of the visible memory segment (e.g., page 206-0 of FIG. 2B) to a visible page pointer 316. The visible page pointer (VPP) 316 can be a register that can store the address of the visible page. The visible page pointer 316 can be accessed by devices external to the OTP emulator 112 as well as modules within the OTP emulator 112 to identify the visible page.

The program module 304 is operable to read data stored in the visible memory segment and update the read data with additional data provided with an OTP write instruction. The data can be read during a read instruction, or in response to an OTP write instruction that is received by the OTP emulator 112. The program module 304 can update the read data by including the additional data with the read data. In turn, the program module 304 can write the updated data to a target memory location (e.g., page 206-2 of FIG. 2C). The target memory location can be, for example, another memory segment that has not been programmed since the last erase (e.g., a blank page at logic value FF). In some implementations, the target memory segment is a blank page of NAND Flash memory.

In some implementations, the program module 304 can also be operative to erase a memory block when the visible memory segment is located in another memory block. The program module 304 can identify the location of the visible memory segment (e.g., page 206-0 of FIG. 2B), for example, based on the value stored in the visible page pointer 316. In turn, the program module 304 can compare the address stored in the visible page pointer 316 to addresses of pages contained in the block to be erased. If the address stored in the visible page pointer 316 does not correspond to the addresses of the pages contained in the block (e.g., memory block 204 of FIG. 2A) to be erased, then the program module 304 can erase the block.

In some implementations, the program module 304 can be further operable to erase a memory block when the visible memory segment corresponds to a particular memory segment. For example, if pages in a memory structure are programmed sequentially, then the program module 304 can erase a memory block (e.g., memory block 204 of FIG. 2A) when the visible memory segment corresponds to a lowest page address that is associated with another memory block (e.g., page 206-0 of FIG. 2A).

The security module 306 can be operable to set a security flag in a security memory segment. The security module 306 can set the security flag, for example, when programming of a corresponding page of memory is complete. The security flag can be defined by a byte of memory (e.g., byte 212-1 of FIG. 2D) that is located, for example, in a security memory segment (e.g., page 206-3 of FIG. 2D). The security module 306 can set the security flag by storing a defined value (e.g., hexadecimal value 00) in the byte of memory that defines the security flag. The security memory segment can be implemented as a page of NAND Flash memory that corresponds to a page of NAND Flash memory used to store OTP data (e.g., page 206-2 of FIG. 2D). In these implementations, the security byte can be used to identify the corresponding page of memory as programmed and locked.

The segment integrity module 308 can be operable to determine if the target memory segment is programmed. Even though a target memory segment (e.g., page 206-2 of FIG. 2C may not be locked (e.g., security flag not set), the target memory segment can still contain data from a previous program attempt. This situation can arise, for example, if power is interrupted during programming of a page. Because the security flag (e.g., 212-1 of FIG. 2C) can be set after the page is programmed, it is possible that partial data was programmed to the target segment, but not completed. Accordingly, the security flag (e.g., byte 212-1 of FIG. 2C) associated with the target memory segment may not be set and, therefore, may not prevent programming of the target memory segment. Therefore, the segment integrity module 308 can determine whether the target memory segment is programmed by comparing a value stored in the target memory segment to an erase value.

For example, the segment integrity module 308 can examine the values stored in the bytes of the target page. If all of the values correspond to an erase value (e.g., hexadecimal FF), then the page has not been programmed since the last erase, and the segment integrity module 308 can allow the target memory segment to be programmed. However, if any of the bytes do not correspond to the erase value, then partial programming may have occurred and the page can be bypassed.

§4.0 Example Process Flow

Figure 4:
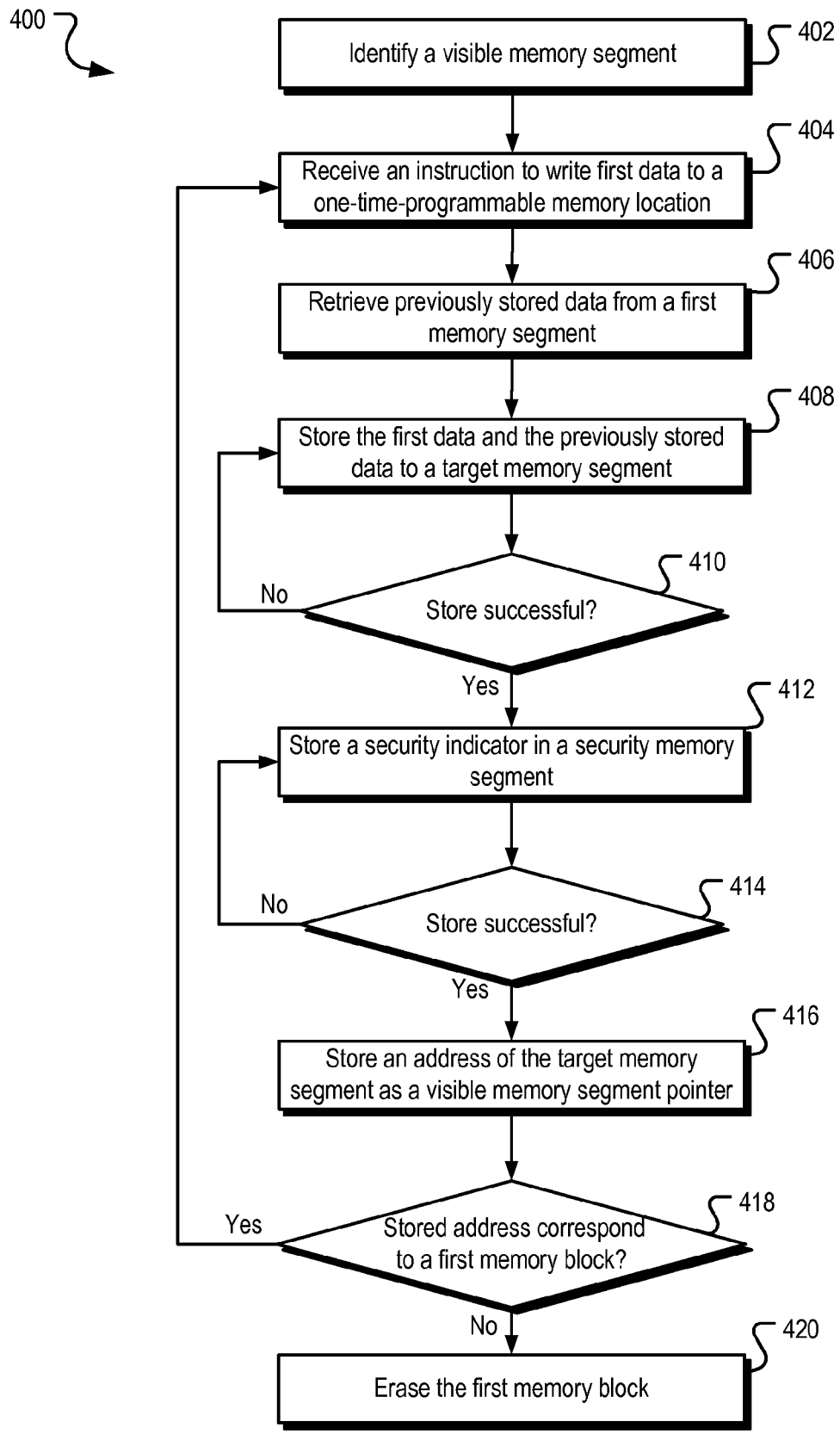
FIG. 4 is a flow chart of an example process of emulating OTP memory with NAND Flash memory.

FIG. 4 is a flow chart of an example process 400 of emulating OTP memory with NAND Flash memory. The process 400 can be implemented, for example, in the OTP emulator 112 and/or OTP emulation system 200.

Stage 402 identifies a visible memory segment. In some implementations, the visible memory segment (e.g., page 206-0 of FIG. 2B), can correspond to a last page to be successfully programmed. The last page to be successfully programmed can be identified, for example, by identifying a page that has a security flag set, indicating that the page has been successfully programmed, and having a highest page address. In other implementations, the visible memory segment can be a default memory segment (e.g., no memory segments have been successfully programmed). The visible memory segment can be defined by a page of NAND Flash memory. The visible memory segment can be identified, for example, by the visible segment identification module 302.

Stage 404 receives an instruction to write first data to a one-time-programmable memory location. The one-time-programmable memory location can be located, for example, in the visible memory segment (e.g., page 206-0 of FIG. 2B). The instruction can be received, for example, by the OTP emulator 112.

Stage 406 retrieves previously stored data from a first memory segment. In some implementations, the first memory segment can be a page of NAND Flash memory that has an address corresponding to the visible memory segment (e.g., page 206-0 of FIG. 2B). The previously stored data can be retrieved, for example, by the program module 304.

Stage 408 stores the first data and the previously stored data to a target memory segment. In some implementations, the target memory segment is a blank page of NAND Flash memory (e.g., page 206-2 of FIG. 2C). The first data and previously stored data can be stored to the target memory segment, for example, by the program module 304.

Stage 410 determines whether the data was stored in the target page successfully. If the data was successfully stored in the target page (e.g., page 206-2 of FIG. 2B), the process can continue to stage 412. If the data was not stored successfully, the process can return to stage 408. The determination can be made, for example, by the program module 304.

Stage 412 stores a security indicator in a security memory segment. In some implementations, the security memory segment (e.g., page 206-3 of FIG. 2D) is associated with the target memory segment (e.g., page 206-2 of FIG. 2D) and identifies the target memory segment as locked. The security indicator can be, for example, a byte of data (e.g., byte 212-1 of FIG. 2D) that has a defined value. The security indicator can be stored, for example, by the security module 306.

Stage 414 determines whether the security indicator was stored successfully. If the security indicator was stored successfully (e.g., stored in the security bit 212-1 of FIG. 2D), then the process 400 can continue to stage 416. If the security indicator was not stored successfully, then the process 400 can continue to stage 412. The determination can be made, for example, by the security module 306.

Stage 416 stores an address of the target memory segment as a visible memory segment pointer. In some implementations, storing the address of the target memory segment (e.g., page 206-2 of FIG. 2D) as the visible memory segment pointer defines the target memory segment as the visible memory segment. The target memory segment address can be stored as the visible memory segment pointer, for example, by the security module 306.

Stage 418 determines whether the address stored as the visible memory segment pointer corresponds to a first memory block. If the visible memory segment pointer corresponds to a page address that is not located in the first memory block, then process 400 can continue to stage 420. For example, the first memory block (e.g., memory block 202 of FIG. 2A) can correspond to the memory block in which the previous visible memory segment pointer was located. If the visible memory segment pointer corresponds to a page address that is located in the first block (e.g., the same memory block as the previous visible memory segment pointer), then the process 400 can continue to stage 404. The determination can be made, for example, by the program module 304.

Stage 420 erases the first memory block. In some implementations, the erase can reset each page (e.g., pages 206-0-206-6) of the memory block (e.g., memory block 202 of FIG. 2A) to a default value (e.g., hexadecimal value FF). The erase can be performed, for example, by the program module 304.

While this document contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while process steps are depicted in the drawings in a particular order, this should not be understood as requiring that such process steps be performed in the particular order shown or in sequential order, or that all illustrated process steps be performed, to achieve desirable results.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results.

What is claimed is:

1. A method comprising:
   receiving an instruction to write first data to a one-time-programmable memory location in a visible memory segment, wherein the visible memory segment comprises a plurality of memory locations;
   identifying the memory segment that corresponds to the visible memory segment, wherein identifying the memory segment that corresponds to the visible memory segment comprises identifying a memory segment that is associated with a security indicator;
   retrieving previously stored data from a first memory segment that has been identified as the visible memory segment;
   storing the first data and the previously stored data to a target memory segment, the target memory segment being a different memory segment than the first memory segment; and
   storing a security indicator in a security memory segment associated with the target memory segment that identifies the target memory segment as locked; and
   updating a visible memory segment pointer with an address of the memory segment that is associated with the security indicator, wherein updating the visible memory segment pointer with the address of the memory segment that is associated with the security indicator comprises updating the visible memory segment pointer with a lowest address of a memory segment that is associated with the security indicator.

2. The method of claim 1, further comprising:
   erasing a memory block based on the visible memory segment pointer, wherein the memory block comprises a plurality of memory segments, and at least one of the plurality of memory segments includes the first memory segment.

3. The method of claim 2, wherein erasing the memory block based on the visible segment pointer comprises erasing the memory block when the visible memory segment pointer identifies an address corresponding to a memory segment that is located in another memory block.

4. The method of claim 1, wherein the first memory segment, the target memory segment, and the security memory segment comprise defined portions of a NAND Flash memory.

5. The method of claim 1, further comprising determining whether the target memory segment has been programmed.

6. The method of claim 5, wherein determining whether the target memory segment has been programmed comprises:
   comparing a value of the security memory segment that is associated with the target memory segment to a first defined value; and
   comparing a value of the target memory segment to a second defined value.

7. A one-time-programmable emulation system, comprising:
   a visible segment identification module to identify a first memory segment that corresponds to a visible memory segment for a peripheral device, wherein the visible memory segment comprises a plurality of memory locations and the first memory segment is a memory segment that is associated with a security flag;
   a program module to:
      receive instructions to write first data to a one-time-programmable memory location in the visible memory segment;
      read data previously stored in the first memory segment that corresponds to the visible memory segment; and
      store the data read from the visible memory segment and the first data in a target memory segment; and
   a security module to:
      set a security flag in a security memory segment corresponding to the target memory segment that identifies the target memory segment as a locked memory segment; and
      update a visible memory segment pointer with a lowest address of a memory segment that is associated with the security flag.

8. The system of claim 7, wherein the program module is operable to erase a memory block when the visible memory segment is located in another memory block.

9. The system of claim 7, further comprising a segment integrity module to determine if the target segment is programmed.

10. The system of claim 9, wherein the segment integrity module is operable to compare a value of the security memory segment that is associated with the target memory segment to a first defined value.

11. The system of claim 10, wherein the segment integrity module is operable to compare a value of the target memory segment to a second defined value.

12. A one-time-programmable emulation device, comprising:
   means for receiving an instruction to write first data to a one-time-programmable memory location in a visible memory segment, wherein the visible memory segment comprises a plurality of memory locations;

means for identifying a first memory segment that corresponds to the visible memory segment, the first memory segment being a memory segment that is associated with a security indicator;

means for retrieving previously stored data from the first memory segment that corresponds to the visible memory segment;

means for storing the first data and the previously stored data to a target memory segment;

means for storing a security indicator in a security memory segment associated with the target memory segment that identifies the target memory segment as locked; and means for updating a visible memory segment pointer with a lowest address of a memory segment that is associated with the security indicator.

13. A method, comprising:

receiving an instruction to write first data to a one-time-programmable memory location in a visible memory segment, wherein the visible memory segment comprises a plurality of one-time-programmable memory locations;

identifying a first memory segment that corresponds to the visible memory segment, the first memory segment being a memory segment that is associated with a security indicator;

retrieving previously stored data from the first memory segment that corresponds to the visible memory segment;

storing the first data and the previously stored data to a target memory segment;

storing a security indicator in a security memory segment associated with the target memory segment that identifies the target memory segment as locked; and updating a visible memory segment pointer with a lowest address of a memory segment that is associated with the security indicator.

14. The method of claim 13, further comprising erasing a memory block based on the visible memory segment pointer, wherein the memory block comprises a plurality of memory segments, and at least one of the plurality of memory segments includes the first memory segment.

15. The method of claim 14, wherein erasing the memory block based on the visible segment pointer comprises erasing the memory block when the visible memory segment pointer identifies an address corresponding to a memory segment that is located in another memory block.

16. The method of claim 13, further comprising determining whether the target memory segment has been programmed.

17. The method of claim 16, wherein determining whether the target memory segment has been programmed comprises:

comparing a value of the security memory segment that is associated with the target memory segment to a first defined value; and comparing a value of the target memory segment to a second defined value.

* * * * *